(12) United States Patent
Wada (10) Patent No.: US 12,261,065 B2
(45) Date of Patent: Mar. 25, 2025

(54) CONTROL DEVICE AND CONTROL METHOD FOR SINGLE-WAFER PROCESSING EPITAXIAL GROWTH APPARATUS, AND EPITAXIAL WAFER PRODUCTION SYSTEM

(71) Applicant: SUMCO Corporation, Tokyo (JP)

(72) Inventor: Naoyuki Wada, Tokyo (JP)

(73) Assignee: SUMCO Corporation, Tokyo (JP)

( * ) Notice: Subject to any disclaimer, the term of this patent is extended or adjusted under 35 U.S.C. 154(b) by 544 days.

(21) Appl. No.: 17/807,705

(22) Filed: Jun. 17, 2022

(65) Prior Publication Data

US 2022/0406599 A1 Dec. 22, 2022

(30) Foreign Application Priority Data

Jun. 18, 2021 (JP) ................................. 2021-101969

(51) Int. Cl.
*H01L 21/67* (2006.01)
(52) U.S. Cl.
CPC .. *H01L 21/67253* (2013.01); *H01L 21/67023* (2013.01)
(58) Field of Classification Search
CPC ......... H01L 21/67253; H01L 21/67023; H01L 21/67115; H01L 21/67017; C30B 25/165
See application file for complete search history.

(56) References Cited

U.S. PATENT DOCUMENTS

| 2012/0174859 | A1* | 7/2012 | Sakamoto | C30B 25/12 117/88 |
| 2013/0260328 | A1* | 10/2013 | Takenaga | H01L 21/67248 432/9 |
| 2019/0316274 | A1* | 10/2019 | Sato | C30B 25/165 |
| 2020/0149187 | A1* | 5/2020 | Ito | C30B 29/06 |

FOREIGN PATENT DOCUMENTS

| JP | S60077415 A | 5/1985 |
| JP | 2019204975 | 11/2019 |

(Continued)

OTHER PUBLICATIONS

Taiwan Office Action as mailed on Dec. 7, 2022, issued in Taiwan Application No. 111115769, 23 pages.

(Continued)

*Primary Examiner* — Kyoung Lee
*Assistant Examiner* — Sophia W Kao
(74) *Attorney, Agent, or Firm* — CHRISTENSEN O'CONNOR JOHNSON KINDNESS PLLC (57) ABSTRACT

A control device includes a calculation unit generating control information for an epitaxial growth apparatus; and a storage unit storing measurement values for an epitaxial film formed by the epitaxial growth apparatus and measurement values for epitaxial films formed by a plurality of other epitaxial growth apparatuses that are provided in the same production line as the epitaxial growth apparatus that needs new control. The calculation unit generates and outputs information for controlling at least one of the supply time of a source gas and the flow rate of a dopant gas in the epitaxial growth apparatus based on the measurement values for the epitaxial film formed by the epitaxial growth apparatus that needs new control and the measurement values of the epitaxial films formed by the other epitaxial growth apparatuses in the same production line that are in operation concurrently with the epitaxial growth apparatus.

13 Claims, 3 Drawing Sheets

(56) References Cited

FOREIGN PATENT DOCUMENTS

TW     200802542 A    1/2008
WO     2011033752 A1  3/2011

OTHER PUBLICATIONS

JP Office Action dated Feb. 20, 2024 for JP Pat. App. No. 2021-101969.

* cited by examiner

CONTROL DEVICE AND CONTROL METHOD FOR SINGLE-WAFER PROCESSING EPITAXIAL GROWTH APPARATUS, AND EPITAXIAL WAFER PRODUCTION SYSTEM

CROSS-REFERENCE TO RELATED APPLICATIONS

This application claims priority to Japanese Patent Application No. 2021-101969, filed on Jun. 18, 2021, the entire disclosure of which is incorporated herein by reference.

TECHNICAL FIELD

This disclosure relates to a control device and a control method for single-wafer processing epitaxial growth apparatuses configured to produce an epitaxial wafer by growing an epitaxial film on a front surface of a wafer, and to an epitaxial wafer production system including a plurality of such single-wafer processing epitaxial growth apparatuses.

BACKGROUND

In the field of semiconductor electronics in which products are increasingly required to exhibit higher performance and higher functionality, the quality of an epitaxial wafer significantly influences the quality of a resulting product device. An epitaxial wafer is a semiconductor wafer having an epitaxial film formed on a surface thereof by vapor phase epitaxy. The epitaxial film formed is of high quality in that it has crystal axes aligned in accordance with the regular arrangement of atoms thereat.

For the production of such epitaxial wafers, batch-processing epitaxial growth apparatuses capable of simultaneously performing epitaxial growth on a plurality of semiconductor wafers have been conventionally used. However, such batch-processing epitaxial growth apparatuses as described above are unsuitable for the production of large-diameter semiconductor wafers. Hence, a single-wafer processing epitaxial growth apparatus that performs epitaxial growth individually on a single semiconductor wafer as described in WO 2011/033752 A (PTL 1) has been commonly used in recent years.

In epitaxial wafer production using the single-wafer processing epitaxial growth apparatus, the thickness of an epitaxial film is typically controlled by adjusting the supply time of a source gas (epitaxial growth time) with the concentration and the flow rate of the source gas being controlled to be as constant as possible. The resistivity of the epitaxial film is typically controlled by adjusting the flow rate of a dopant gas with the concentration of the dopant gas being controlled to be as constant as possible.

CITATION LIST

Patent Literature

PTL 1: WO 2011/033752 A

SUMMARY

The present inventor has conducted intensive studies to address the challenges stated above and found the following.

A control device for single-wafer processing epitaxial growth apparatuses, according to an embodiment of this disclosure includes:

a calculation unit generating control information of one of a plurality of epitaxial growth apparatuses that needs new control, the apparatuses being provided in one production line to produce an epitaxial wafer by forming an epitaxial film on a surface of a wafer using a dopant gas and a source gas supplied from one source gas source as materials; and a storage unit storing at least one of a measured thickness and a measured resistivity of an epitaxial film formed in the epitaxial growth apparatus that needs new control in the plurality of epitaxial growth apparatuses provided in the same production line, at least one of a measured thickness and a measured resistivity of an epitaxial film formed in another one of the other epitaxial growth apparatuses in the same production line that is concurrently in operation with the epitaxial growth apparatus that needs new control, and specifications of a product that are set in the epitaxial growth apparatus that needs new control.

The calculation unit generates information for controlling at least one of a supply time of the source gas and a flow rate of the dopant gas in the epitaxial growth apparatus that needs new control, based on at least one of the measured thickness and the measured resistivity of the epitaxial film formed in the epitaxial growth apparatus that needs new control and at least one of the measured thickness and the measured resistivity of the epitaxial film formed in said another epitaxial growth apparatus in the same production line that is concurrently in operation, the measurement values being stored in the storage unit; and outputs the information to the epitaxial growth apparatus that needs new control.

A control method for single-wafer processing apparatuses, according to one embodiment of this disclosure that includes a control device controlling one of a plurality of epitaxial growth apparatuses that needs new control, the apparatuses being provided in one production line to produce an epitaxial wafer by forming an epitaxial film on a surface of a wafer using a dopant gas and a source gas supplied from one source gas source as materials, includes:

a step of storing at least one of a measured thickness and a measured resistivity of an epitaxial film formed in the epitaxial growth apparatus that needs new control in the plurality of epitaxial growth apparatuses provided in the same production line, and at least one of a measured thickness and a measured resistivity of an epitaxial film formed in each of the other epitaxial growth apparatuses in the same production line that are concurrently in operation with the epitaxial growth apparatus that needs new control, the step being performed by the control device; and a step of generating information for controlling at least one of a supply time of the source gas and a flow rate of the dopant gas in the epitaxial growth apparatus that needs new control, based on at least one of the measured thickness and the measured resistivity of the epitaxial film formed in the epitaxial growth apparatus that needs new control and at least one of the measured thickness and the measured resistivity of the epitaxial film formed in each of the other epitaxial growth apparatuses in the same production line that are concurrently in operation, the measurement values being stored; and outputting the information to the epitaxial growth apparatus that needs new control, the step being performed by the control device.

An epitaxial wafer production system according to one embodiment of this disclosure includes the control device for single-wafer processing epitaxial growth apparatuses, and the plurality of epitaxial growth apparatuses provided in one production line.

DETAILED DESCRIPTION

For an epitaxial wafer as a product (hereafter referred to as "product-use epitaxial wafer"), the thickness and the resistivity of an epitaxial film need to be within a target thickness range and a target resistivity range defined in the specifications, respectively. A method of determining the source gas supply time and the dopant gas flow rate for producing such an epitaxial wafer that conform to the specifications can be typically performed by: preparing a measurement-use epitaxial wafer by growing an epitaxial film on a wafer not to be a product (hereafter referred to as "monitor wafer") under predetermined conditions of source gas supply time and dopant gas flow rate; then measuring the thickness and the resistivity of the epitaxial film; and comparing the measured thickness with the target thickness range and the target resistivity range defined in the specifications (specification data).

For example, in the case where the target thickness range is 3.90 µm to 4.10 µm (specification center: 4.00 µm), when the concentration and the flow rate of a source gas are controlled to be constant and the thickness of the epitaxial film grown on the monitor wafer using a source gas supply time t1 is 4.02 µm; an epitaxial film having a thickness larger than the specification center by 0.5% is formed, thus the subsequent product-use epitaxial wafer productions can be performed using a source gas supply time t2 of t2=t1×0.995 that is shorter than t1 by 0.5%.

Similarly, in the case where the target resistivity range is 9.0 Ω·cm to 11.0 Ω·cm (specification center: 10.0 Ω·cm), when the concentration of a dopant gas is controlled to be constant and the resistivity of the epitaxial film grown on the monitor wafer at a dopant flow rate D1 is 10.1 Ω·cm, an epitaxial film having a resistivity higher than the specification center by 1% is formed, thus the subsequent product-use epitaxial wafer productions can be performed at a dopant flow rate D2 of D2=D1×1.01 that is higher than D1 by 1%.

In view of this, we contemplated a method (hereafter referred to as "comparative example method") whereby, each time a given number of (e.g., 200) product-use epitaxial wafers are produced, an epitaxial film is grown on a monitor wafer to produce a measurement-use epitaxial wafer, and the source gas supply time and the dopant gas flow rate used in the subsequent production of the given number of (e.g., 200) product-use epitaxial wafers are determined based on the result of measuring the thickness and the resistivity of the epitaxial film. As described above, with the comparative example method by which the source gas supply time and the dopant gas flow rate in the subsequent product-use epitaxial wafer productions are determined based on the result of measuring the thickness and resistivity of the epitaxial film grown on the monitor wafer, an epitaxial wafer having an epitaxial film whose thickness and resistivity are close to the respective specification centers can conceivably be produced.

However, studies made by the present inventor found that, in the case of consecutively producing a large number of epitaxial wafers using the same epitaxial growth apparatus in the comparative example method, the deviations of the thickness and resistivity of the epitaxial film from the respective specification centers cannot be reduced sufficiently. Especially when epitaxial wafers are consecutively produced using the same epitaxial growth apparatus, the deviations of the thickness and resistivity of the resultant epitaxial films from the respective specification centers would be high.

In the comparative example method, one or more operators: (i) measure the thickness and resistivity of the epitaxial film grown on the monitor wafer; (ii) determine the subsequent source gas supply time and dopant gas flow rate based on the measurement result; and (iii) set the determined source gas supply time and dopant gas flow rate in the epitaxial growth apparatus. There is thus no conventional production system for automatically applying a method for determining (correcting) the source gas supply time and the dopant gas flow rate to the epitaxial growth apparatus.

It could therefore be helpful to provide a control device and a control method for single-wafer processing epitaxial growth apparatuses, and an epitaxial wafer production system that make it possible to control the source gas supply time and the dopant gas flow rate with high accuracy, thereby reducing the deviations of the thickness and resistivity of epitaxial films from the respective specification centers.

The inventor made diligent studies to address the above challenges and found the following. The inventor investigated the reason that, with the comparative example method, the deviations of the thickness and resistivity of the epitaxial films consecutively produced using the same epitaxial growth apparatus from the respective specification centers increase, and presumed the cause to be an effect of a phenomenon that the concentration of the source gas varies. Specifically, the concentration of the source gas has an influence on the thickness and resistivity of the epitaxial films. When a source gas is supplied from one and the same source gas source to a plurality of epitaxial growth apparatuses, the concentration of the source gas may vary significantly. Further, as the number of epitaxial apparatuses in operation increases, since the concentration of the source gas supplied from the source gas source is reduced, the epitaxial growth rate is reduced. In such a case, the thickness of the epitaxial films formed using the same source gas supply time is reduced as the number of apparatuses in operation increases. In addition, as the epitaxial growth rate decreases, the amount of the dopant incorporated into the epitaxial film per unit time increases. Consequently, the resistivity of the epitaxial films formed at the same dopant flow rate is lower as the number of the apparatus in operation is larger. Accordingly, the inventor assumed that the thickness and resistivity of epitaxial films produced in the plurality of epitaxial growth apparatuses in which the source gas is supplied from the same source gas source are influenced. The above comparative example method cannot timely reflect the effect of reduction in the epitaxial growth rate with such a reduction in the source gas concentration.

The inventor studied a method of correcting the source gas supply time and the dopant gas flow rate by which the influence of the reduction in the epitaxial growth rate caused by the reduction in the source gas concentration can be reflected timely. It was then found that the reduction in the source gas concentration has a correlation with the operation state of the production line to which the source gas is supplied from the same source gas source, in other words, although the detailed mechanism will be described below, when the number of epitaxial apparatuses in the same production line is larger, the source gas concentration is likely lower. The inventor then discovered the following: By performing, for the correction of the source gas supply time and the dopant gas flow rate, not only correction based on the result of comparing the measured thickness and resistivity of the epitaxial film produced in the epitaxial growth apparatus concerned, with the target thickness range and the target resistivity range, respectively, as in the comparative example method but also correction based on the variation trend of the thickness and resistivity of the epitaxial film in the other apparatuses that are concurrently in operation with the relevant apparatus in the same production line (at least part of their operation times overlap), the deviations of the thickness and resistivity of the epitaxial film from the respective specification centers can be reduced. Thus, a control device and a system that make it possible to automatically determine (correct) the source gas supply time and the dopant gas flow rate as above have been developed.

This disclosure is based on the above discoveries, and includes the following features.

[1] A control device for single-wafer processing epitaxial growth apparatuses, comprising:
a calculation unit generating control information of one of a plurality of epitaxial growth apparatuses that needs new control, the apparatuses being provided in one production line to produce an epitaxial wafer by forming an epitaxial film on a surface of a wafer using a dopant gas and a source gas supplied from one source gas source as materials; and
a storage unit storing at least one of a measured thickness and a measured resistivity of an epitaxial film formed in the epitaxial growth apparatus that needs new control in the plurality of epitaxial growth apparatuses provided in the same production line, at least one of a measured thickness and a measured resistivity of an epitaxial film formed in another one of the other epitaxial growth apparatuses in the same production line that is concurrently in operation with the epitaxial growth apparatus that needs new control, and specifications of a product that are set in the epitaxial growth apparatus that needs new control,
wherein the calculation unit generates information for controlling at least one of a supply time of the source gas and a flow rate of the dopant gas in the epitaxial growth apparatus that needs new control, based on at least one of the measured thickness and the measured resistivity of the epitaxial film formed in the epitaxial growth apparatus that needs new control and at least one of the measured thickness and the measured resistivity of the epitaxial film formed in said another epitaxial growth apparatus in the same production line that is concurrently in operation, the measurement values being stored in the storage unit; and outputs the information to the epitaxial growth apparatus that needs new control.

[2] The control device for single-wafer processing epitaxial growth apparatuses, according to [1] above, wherein when a measured thickness of an epitaxial film formed at a predetermined time in said another epitaxial growth apparatus in the same production line is smaller than a measured thickness of the epitaxial film formed at a time prior to the predetermined time by a predetermined ratio or more, the measured thicknesses being read from the storage unit, the calculation unit corrects the supply time of the source gas to be longer, and generates the corrected value as information for controlling the supply time of the source gas.

[3] The control device for single-wafer processing epitaxial growth apparatuses, according to [1] or [2] above, wherein when a measured resistivity of the epitaxial film formed at a predetermined time in said another epitaxial growth apparatus in the same production line is lower than a measured resistivity of an epitaxial film formed at a time prior to the predetermined time by a predetermined ratio or more, the measured resistivities being read from the storage unit, the calculation unit corrects the flow rate of the dopant gas to be lower, and generates the corrected value as information for controlling the flow rate of the dopant gas.

[4] The control device for single-wafer processing epitaxial growth apparatuses, according to [1] or [2] above, wherein when a measured thickness of an epitaxial film formed at a predetermined time in said another epitaxial growth apparatus in the same production line is larger than a measured thickness of the epitaxial film formed at a time prior to the predetermined time by a predetermined ratio or more, the measured thicknesses being read from the storage unit, the calculation unit corrects the supply time of the source gas to be shorter, and generates the corrected value as information for controlling the supply time of the source gas.

[5] The control device for single-wafer processing epitaxial growth apparatuses, according to [1] or [2] above, wherein when a measured resistivity of the epitaxial film formed at a predetermined time in said another epitaxial growth apparatus in the same production line is higher than a measured resistivity of an epitaxial film formed at a time prior to the predetermined time by a predetermined ratio or more, the measured resistivities being read from the storage unit, the calculation unit corrects the flow rate of the dopant gas to be higher, and generates the corrected value as information for controlling the flow rate of the dopant gas.

[6] A control method for single-wafer processing apparatuses including a control device controlling one of a plurality of epitaxial growth apparatuses that needs new control, the apparatuses being provided in one production line to produce an epitaxial wafer by forming an epitaxial film on a surface of a wafer using a dopant gas and a source gas supplied from one source gas source as materials, comprising: a step of storing at least one of a measured thickness and a measured resistivity of an epitaxial film formed in the epitaxial growth apparatus that needs new control in the plurality of epitaxial growth apparatuses provided in the same production line, and at least one of a measured thickness and a measured resistivity of an epitaxial film formed in each of the other epitaxial growth apparatuses in the same production line that are concurrently in operation with the epitaxial growth apparatus that needs new control, the step being performed by the control device; and a step of generating information for controlling at least one of a supply time of the source gas and a flow rate of the dopant gas in the epitaxial growth apparatus that needs new control, based on at least one of the measured thickness and the measured resistivity of the epitaxial film formed in the epitaxial growth apparatus that needs new control and at least one of the measured thickness and the measured resistivity of the epitaxial film formed in each of the other epitaxial growth apparatuses in the same production line that are concurrently in operation, the measurement values being stored; and outputting the information to the epitaxial growth apparatus that needs new control, the step being performed by the control device.

[7] An epitaxial wafer production system comprising the control device for single-wafer processing epitaxial growth apparatuses, according to [1] to [5] above; and the plurality of epitaxial growth apparatuses provided in one production line.

A control device and a control method for single-wafer processing epitaxial growth apparatuses, and an epitaxial wafer production system, according to this disclosure can control the source gas supply time and the dopant gas flow rate with high accuracy, thereby reducing the deviations of the thickness and resistivity of epitaxial films from the respective specification centers.

[Epitaxial Wafer Production System 1000]

Figure 1:
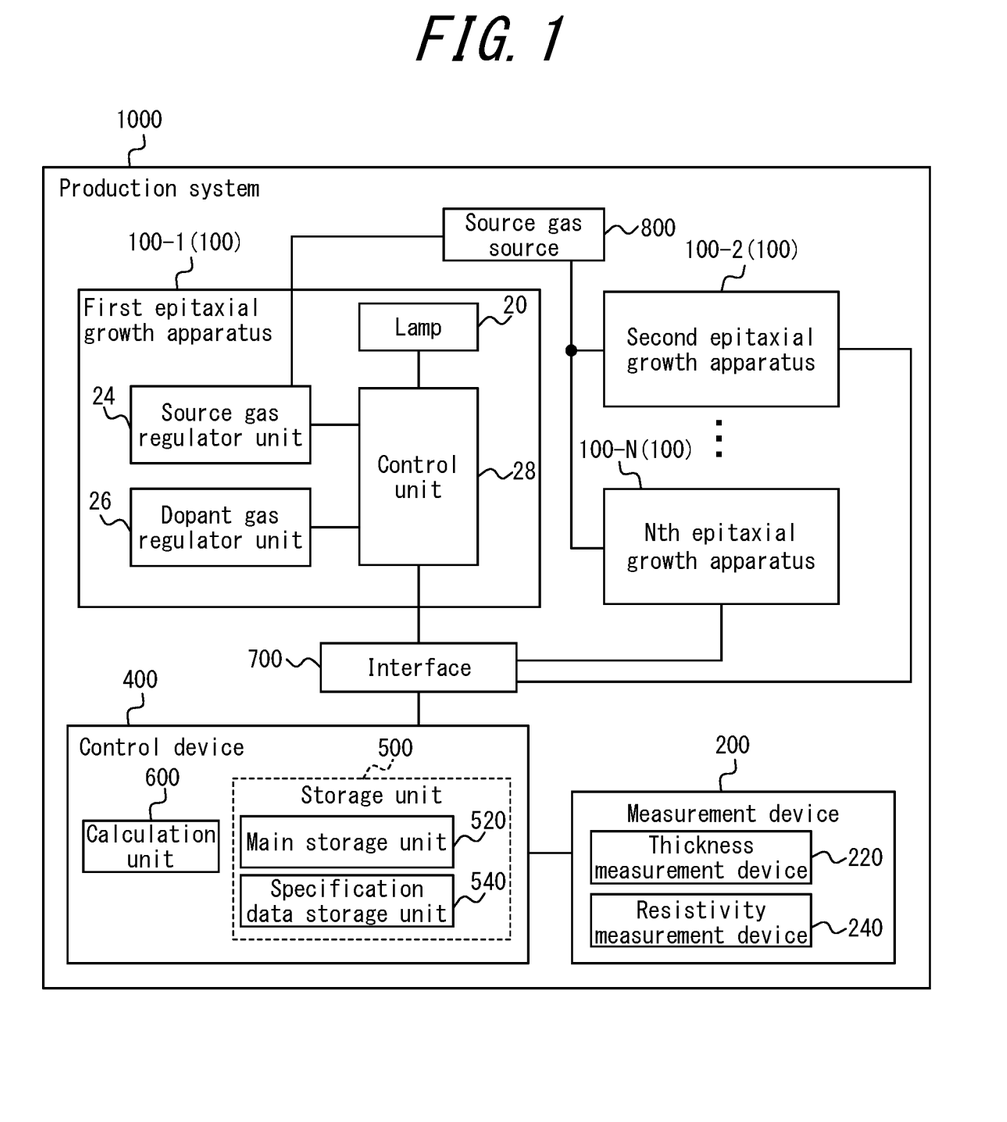
FIG. 1 is an example of the configuration of an epitaxial wafer production system according to an embodiment of this disclosure.

As illustrated in FIG. 1, an epitaxial wafer production system 1000 according to one embodiment of this disclosure includes single-wafer processing epitaxial growth apparatuses 100 and a control device 400.

The production system 1000 includes at least two single-wafer processing epitaxial growth apparatuses 100. Specifically, the production system 1000 includes a first epitaxial growth apparatus 100-1 and a second epitaxial growth apparatus 100-2 as the single-wafer processing epitaxial growth apparatuses 100. The production system 1000 may include N single-wafer processing epitaxial growth apparatuses 100. N is a natural number equal to or larger than 2. When the production system 1000 includes N single-wafer processing epitaxial growth apparatuses 100, the production system 1000 includes the first epitaxial growth apparatus 100-1 to an Nth epitaxial growth apparatus 100-N as the single-wafer processing epitaxial growth apparatuses 100.

The production system 1000 further includes a source gas source 800 that supplies the same source gas to the at least two single-wafer processing epitaxial growth apparatuses 100. The single-wafer processing epitaxial growth apparatuses 100 each configured to produce an epitaxial wafer by forming an epitaxial film on a surface of a wafer using a source gas supplied from one and the same source gas source 800 are also referred to as a plurality of single-wafer processing epitaxial growth apparatus 100 provided in one production line.

The control device 400 outputs information to the single-wafer processing epitaxial growth apparatuses 100 via an interface 700 and acquires information from the single-wafer processing epitaxial growth apparatuses 100. The control device 400 includes a calculation unit 600 and a storage unit 500. The storage unit 500 is not essential, and includes a main storage unit 520 and a specification data storage unit 540. The main storage unit 520 and the specification data storage unit 540 may be built separately or may be integrally built as the storage unit 500.

The production system 1000 is not essential, and further includes a measurement device 200. The measurement device 200 includes a thickness measurement device 220, and a resistivity measurement device 240. The measurement device 200 measures the thickness, the resistivity, or the like of an epitaxial film of an epitaxial wafer produced in each single-wafer processing epitaxial growth apparatus 100.

Each feature will be described in detail below.

(Single-Wafer Processing Epitaxial Growth Apparatus)

Figure 2:
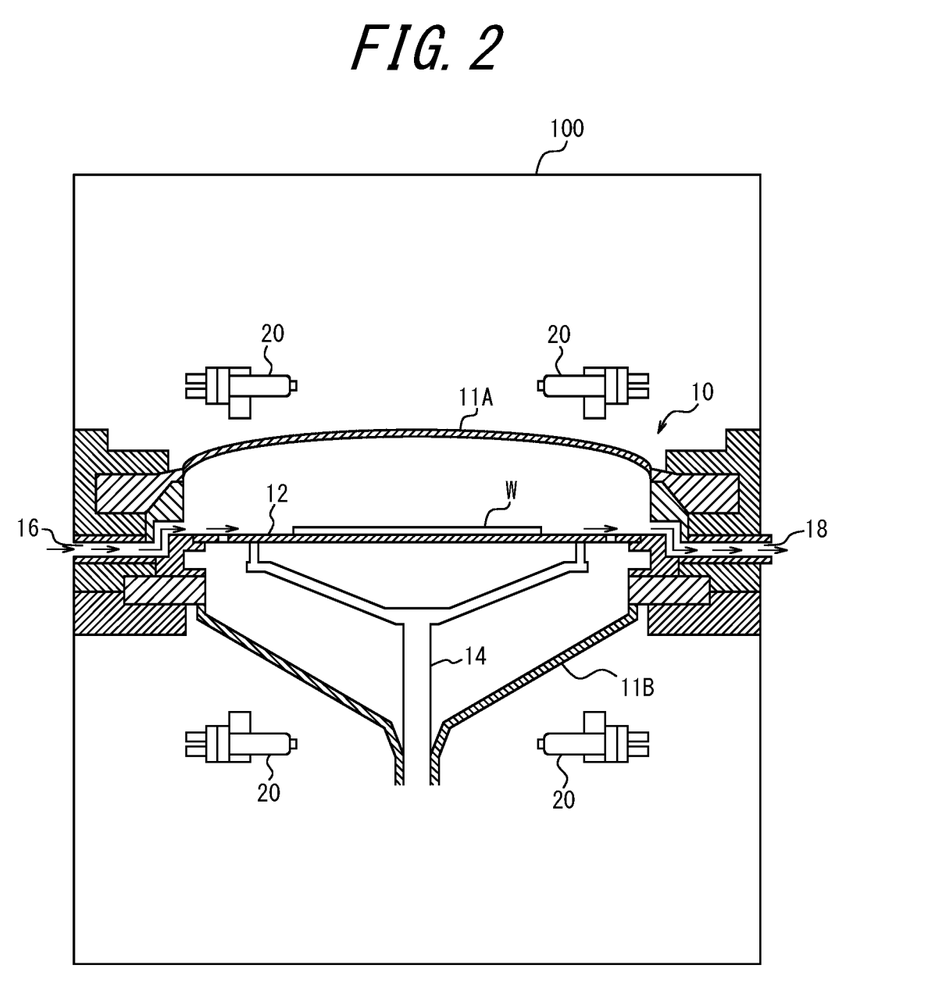
FIG. 2 is a schematic cross-sectional view illustrating an example of the structure of a single-wafer processing epitaxial growth apparatus according to an embodiment of this disclosure.

As illustrated in FIG. 2, each single-wafer processing epitaxial growth apparatus 100 incudes a chamber 10, a susceptor 12, a susceptor support shaft 14, a gas supply port 16, a gas exhaust port 18, and lamps 20. As illustrated in FIG. 1, each single-wafer processing epitaxial growth apparatus 100 further includes a source gas regulator unit 24, a dopant gas regulator unit 26, and a control unit 28.

The chamber 10 includes an upper dome 11A, a lower dome 11B, and a dome mounting body for mounting them, and the chamber 10 defines an epitaxial film formation chamber. The upper dome 11A and the lower dome 11B are desirably be made of quartz. Quartz has excellent heat resistance, and easily transmits light emitted from an infrared lamp. Accordingly, when the upper dome 11A and the lower dome 11B are made of quartz, the wafer W can be heated uniformly.

The susceptor 12 is a disk-shaped member located inside the chamber 10 and is used to have a wafer W placed thereon. For the susceptor 12, carbon graphite as a base material having the surface thereof coated with silicon carbide can be used. A recessed portion (not illustrated) for placing and housing the wafer is formed on the front surface of the susceptor 12.

The susceptor support shaft 14 supports the susceptor 12 from below inside the chamber 10, and the main shaft thereof is approximately coaxial with the center of the susceptor 12. The susceptor support shaft 14 is desirably made of quartz, and is desirably made of synthetic quartz in particular.

At least one gas supply port 16 is provided on the chamber 10, and a source gas, a carrier gas, and a dopant gas are supplied into the chamber 10 through the gas supply port 16. Examples of the source gas include trichlorosilane ($SiHCl_3$) gas and dichlorosilane ($SiH_2Cl_2$) gas, examples of the carrier gas include hydrogen ($H_2$), and examples of the dopant gas include diborane ($B_2H_6$) and phosphine ($PH_3$). At least one gas exhaust port 18 is provided on the chamber 10, and the gas inside the chamber 10 is discharged through the gas exhaust port 18.

The lamps 20 are placed above and below the chamber 10 separately, and heat the wafer W on the susceptor 12. For each lamp 20, a halogen lamp or an infrared lamp which is quickly heated/cooled and has excellent temperature controllability may typically be used.

The source gas regulator unit 24 is configured to control the supply time (epitaxial growth time) of the source gas supplied into the chamber 10 through the gas supply port 16; specifically, the source gas regulator unit is made up of a mass flow controller and air operated valves. In each epitaxial growth, a source gas is supplied into the chamber 10 while the mass flow controller controls the flow rate of the source gas of a constant concentration to be constant. As illustrated in FIG. 1, the source gas regulator unit 24 controls the flow rate of the source gas supplied through the mass controller in accordance with the source gas supply time determined by the control unit 28 to be described and a the opening and closing of the air operated valves provided upstream and downstream of the mass flow controller.

The dopant gas regulator unit 26 is configured to control the flow rate of the dopant gas supplied into the chamber 10 through the gas supply port 16; specifically, the dopant gas regulator unit is made up of a mass flow controller and air operated valves. In each epitaxial growth, a dopant gas of a constant concentration is supplied into the chamber 10. Further, as illustrated in FIG. 1, the dopant gas regulator unit 26 controls the flow rate of a dopant gas to be supplied into the chamber 10 to be the flow rate determined by the control unit 28 to be described using the mass flow controller, and controls the opening and closing of the air operated valves provided upstream and downstream of the mass flow controller.

The control unit 28 may actually be implemented as a central processing unit (CPU) provided on each single-wafer processing epitaxial growth apparatus 100. The control unit 28 controls the overall process of the relevant single-wafer processing epitaxial growth apparatus 100. The control unit 28 particularly controls the source gas regulator unit 24 and the dopant gas regulator unit 26 based on the temperature measured at a predetermined position in the chamber 10 while the outputs of the lamps 20 are controlled.

Next, the control of the source gas regulator unit 24 and the dopant gas regulator unit 26 will be described below. The control unit 28 controls the source gas regulator unit 24 and the dopant gas regulator unit 26 such that the time during which the source gas is supplied and the flow rate of the dopant gas supplied are set to the source gas supply time and the dopant gas flow rate determined by the calculation unit 600 of the control device 400.

Each single-wafer processing epitaxial growth apparatus 100 having the above-described structure is configured to form an epitaxial film on the front surface of the wafer W to produce an epitaxial wafer. Specifically, the wafer W is placed on the susceptor 12 in each single-wafer processing epitaxial growth apparatus 100, the lamps 20 are then lit to heat the wafer W. While gas is discharged through the gas exhaust port 18, the source gas, the carrier gas, and the dopant gas are introduced through the gas supply port 16. The source gas, the carrier gas, and the dopant gas then flow in a laminar flow state along the front surface of the wafer W heated to a predetermined temperature, thus an epitaxial film is grown on the wafer W.

(Thickness Measurement Device 220)

The thickness measurement device 220 measures the thickness of an epitaxial film of each epitaxial wafer produced in the single-wafer processing epitaxial growth apparatuses 100. Specifically, the thickness measurement device 220 measures the thickness of the epitaxial film formed on the wafer W in the single-wafer processing epitaxial growth apparatuses 100. An example of the thickness measurement device 220 used may be an FT-IR thickness measuring device such as the QS-3300 series manufactured by Nanometrics Incorporated. The data of the thickness of epitaxial films measured with the thickness measurement device 220 are stored in the main storage unit 520.

(Resistivity Measurement Device 240)

The resistivity measurement device 240 measures the resistivity of an epitaxial film of each epitaxial wafer produced in single-wafer processing epitaxial growth apparatuses 100. Specifically, the resistivity measurement device 240 measures the resistivity of the epitaxial film formed on the wafer W in the single-wafer processing epitaxial growth apparatuses 100. An example of the resistivity measurement device 240 used may be a resistivity measurement device using the CV method, such as MCV-2200/2500 manufactured by Semilab Japan KK. The data of the resistivity of epitaxial films measured with the resistivity measurement device 240 are stored in the main storage unit 520.

(Main Storage Unit 520)

Referring to FIG. 1, the main storage unit 520 is constituted by an external storage device (data server) connected to the single-wafer processing epitaxial growth apparatuses 100 via the interface 700. The main storage unit 520 stores information described as in (i), (ii), and (iii) below.

(i) A preset source gas supply time t1 and a preset dopant gas flow rate D1 applied to the single-wafer processing epitaxial growth apparatuses 100 (the preset source gas supply time t1 and the preset dopant gas flow rate D1 are included in the conditions for producing epitaxial wafers)

(ii) Measured thicknesses output from the thickness measurement device 220 and measured resistivities output from the resistivity measurement device 240

(iii) measured thicknesses and measured resistivities obtained by measurement with the measurement device 200 on epitaxial wafers produced in the last two cycles in a single-wafer processing epitaxial growth apparatus 100 (for example, the second epitaxial growth apparatus 100-2 in this embodiment) that is concurrently in operation with the first epitaxial growth apparatus 100-1 in the same production line.

Now, the two apparatuses are concurrently in operation, meaning that they are in operation in a state where at least part of their operation times overlap.

(Specification Data Storage Unit 540)

Referring to FIG. 1, the specification data storage unit 540 may be constituted by a typical external storage device. The specification data storage unit 540 stores information described as in (iv) below.

(iv) A target thickness range and a target resistivity range as specification data For example, in the case where the target thickness range is 3.90 μm to 4.10 μm (specification center: 4.00 μm) and the target resistivity range is 9.0 Ω·cm to 11.0 Ω·cm (specification center: 10.0 Ω·cm), these specification data are stored in the specification data storage unit 540. The specification data correspond to part of the specifications of the products to be obtained.

In the control device 400 depicted in FIG. 1, the storage unit 500 includes the main storage unit 520 and the specification data storage unit 540 as separate individual external storage devices, the information of (i), (ii), and (iii) is stored in the main storage unit 520, and the information of (iv) is stored in the specification data storage unit 540. The storage unit 500 may be constructed as a single external storage device. When the storage unit 500 is constructed as a single external storage device, the information of (i) to (iv) can be stored in the single external storage device. The storage unit 500 may be configured to store the information of (i), (ii), (iii), and (iv) separately in different storage devices.

(Calculation Unit 600)

The calculation unit 600 may actually be a central processing unit (CPU) provided in the epitaxial wafer production system 1000. The calculation unit 600 corrects the preset source gas supply time t1 and the preset dopant gas flow rate D1 to determine a corrected source gas supply time t2 and a corrected dopant gas flow rate D2, based on the information of (i), (ii), and (iii) read from the main storage unit 520 and the information of (iv) read from the specification data storage unit 540.

The calculation unit 600 outputs the determined corrected source gas supply time t2 and corrected dopant gas flow rate D2 to the control unit 28 via the interface 700. Having received the output, the control unit 28 controls the source gas regulator unit 24 and the dopant gas regulator unit 26 such that the time during which the source gas is supplied and the flow rate of the dopant gas supplied are set to the corrected source gas supply time t2 and the corrected dopant gas flow rate D2 determined.

The calculation unit 600 also outputs the corrected source gas supply time t2 and corrected dopant gas flow rate D2 determined to the main storage unit 520, and t2 and D2 are sored as a new preset source gas supply time and a new preset dopant gas flow rate, i.e. the information of (i) in the main storage unit 520.

[Epitaxial Wafer Production Method]

Figure 3:
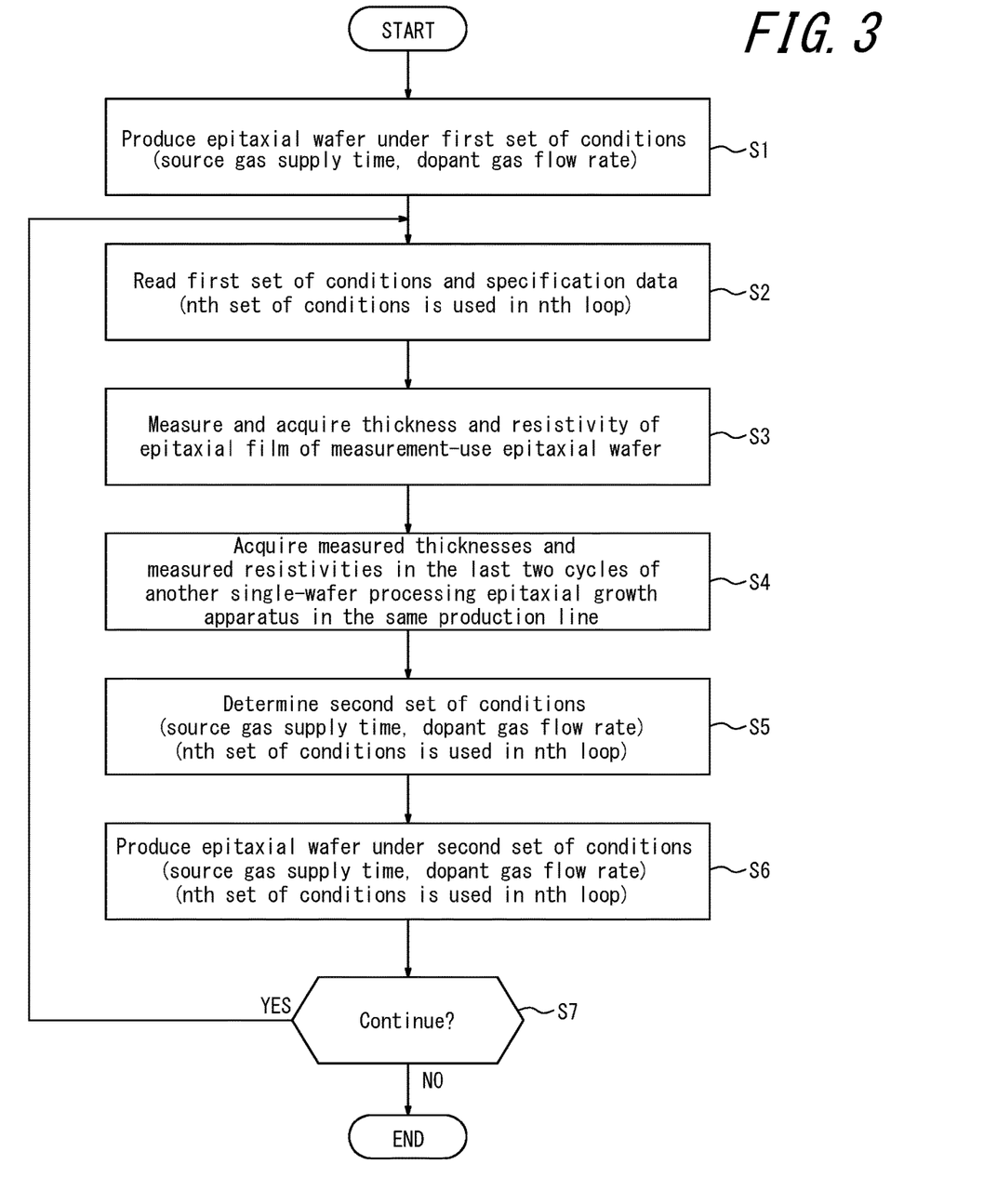
FIG. 3 is a flowchart illustrating an example of the procedure of a control method for single-wafer processing epitaxial growth apparatuses according to an embodiment of this disclosure.

The epitaxial wafer production system 1000 may perform the procedure of an epitaxial wafer production method given in the flowchart in FIG. 3. The epitaxial wafer production method may be implemented as an epitaxial wafer production program to be executed by a processor. The procedure in the flowchart of FIG. 3 may be regarded as a control method to be performed on the single-wafer processing epitaxial growth apparatuses 100 by the control device 400. The control method for the single-wafer processing epitaxial growth apparatuses 100 may be implemented as a control program to be executed by a processor.

(Step S1)

In the production system 1000, the first epitaxial growth apparatus 100-1 produces an epitaxial wafer based on a first set of epitaxial growth conditions (a preset source gas supply time t1 and a preset dopant gas flow rate D0 in the step presented as Step S1. Specifically, the calculation unit 600 of the control device 400 reads the information of the preset source gas supply time t1 and the preset dopant gas flow rate D1 from the main storage unit 520 and outputs the information to the control unit 28 of the first epitaxial growth apparatus 100-1 via the interface 700. The control unit 28 controls the source gas regulator unit 24 and the dopant gas regulator unit 26 such that the time during which the source gas is supplied is set to t1 and the flow rate of the dopant gas supplied is set to D1.

The method of determining t1 and D1 is not limited. For example, t1 and D1 may be determined by growing an epitaxial film on a monitor wafer under the conditions of a predetermined source gas supply time t0 and dopant gas flow rate D0 and then measuring the thickness and resistivity of the epitaxial film and comparing the measured thickness and resistivity with the specification center thickness and resistivity.

For example, in the case where the target thickness range is 3.90 µm to 4.10 µm (specification center: 4.00 µm), when the concentration and the flow rate of the source gas are controlled to be constant and the thickness of the epitaxial film grown on the monitor wafer using the source gas supply time t0 is 4.02 µm, an epitaxial film having a thickness larger than the specification center by 0.5% is formed. Accordingly, the source gas supply time t1 is set to a value smaller than t0 by 0.5%, calculated by a formula: t1=t0×0.995.

Similarly, in the case where the target resistivity range is 9.0 Ω·cm to 11.0 Ω·cm (specification center: 10.0 Ω·cm), when the concentration of the dopant gas is controlled to be constant and the resistivity of the epitaxial film grown on the monitor wafer at the dopant flow rate D0 is 10.1 Ω·cm, an epitaxial film having a resistivity higher than the specification center by 1% is formed. Accordingly, the dopant flow rate D1 is set to a value larger than D0 by 1%, calculated by a formula: D1=D0×1.01.

In the step of Step S1, for example, product-use epitaxial wafers of a number calculated by a formula: 25/lot×8 lots=200 are produced, and then a measurement-use epitaxial wafer using one monitor wafer can be produced.

In the step of Step S1, not only the first epitaxial growth apparatus 100-1 but also the other single-wafer processing epitaxial growth apparatuses 100 including the second epitaxial growth apparatus 100-2 are produced. As described above, the measured thickness and the measured resistivity of the epitaxial film formed in each epitaxial growth apparatus 100 are determined in the process of epitaxial growth in the single-wafer processing epitaxial growth apparatus 100. The data acquired in the process of epitaxial growth in each single-wafer processing epitaxial growth apparatus 100 are stored as temporal data in the main storage unit 520.

(Step S2)

The calculation unit 600 in the control device 400 of the production system 1000 reads the first set of epitaxial growth conditions (the preset source gas supply time t1 and the preset dopant gas flow rate D0 from the main storage unit 520 in the step presented in Step S2. The calculation unit 600 also reads the specification data such as the target thickness range of 3.90 µm to 4.10 µm (specification center tec: 4.00 µm) and the target resistivity range of 9.0 Ω·cm to 11.0 Ω·cm (specification center pec: 10.0 Ω·cm), from the specification data storage unit 540.

(Step S3)

The production system 1000 measures the thickness of an epitaxial film of the measurement-use epitaxial wafer produced under the first set of epitaxial growth conditions using the thickness measurement device 220 and measures the resistivity of the epitaxial film thereof using the resistivity measurement device 240 in the step presented in Step S3. The measured thickness te1 and the measured resistivity ρe1 obtained here are stored in the main storage unit 520. For each of the measured thickness te1 and the measured resistivity ρe1, the average of measurement values at a plurality of points in the wafer plane is preferably used. For example, the average of measurement values at a plurality of points (e.g., four to eight points) at the same distance (e.g., R/2) from the wafer center may be used, where R is the wafer radius.

The calculation unit 600 then acquires the measured thickness te1 and the measured resistivity ρe1 of the epitaxial film from the main storage unit 520.

(Step S4)

The calculation unit 600 in the control device 400 of the production system 1000 reads measured thicknesses and measured resistivities in the last two cycles of another epitaxial apparatus concurrently in operation in the same production line from the main storage unit 520 in the step presented in Step S4. The measurement values read are stored as temporal data in the main storage unit 520. Thus, for example, the variation in thickness can be determined from the last measured thicknesses teB1 and teB2 in another epitaxial apparatus B.

The order in which Steps S2, S3, and S4 are performed is not limited.

(Step S5)

The calculation unit 600 in the control device 400 of the production system 1000 corrects the preset source gas supply time t1 and the preset dopant gas flow rate D1 to determine a corrected source gas supply time t2 and a corrected dopant gas flow rate D2, based on the information of (i), (ii), and (iii) read from the main storage unit 520 and the information of (iv) read from the specification data storage unit 540 in the step presented as Step 5. The corrected source gas supply time t2 and the corrected dopant gas flow rate D2 correspond to the control information for the single-wafer processing epitaxial growth apparatuses 100. Namely, the calculation unit 600 generates control information for one of the single-wafer processing epitaxial growth apparatuses 100 that needs new control on the growth conditions for an epitaxial film. The information includes:

(i) a preset source gas supply time t1 and a preset dopant gas flow rate D1 applied to one of the single-wafer processing epitaxial growth apparatuses 100;

(ii) a measured thickness output from the thickness measurement device 220 and a measured resistivity output from the resistivity measurement device 240;

(iii) measured thicknesses in the last two cycles of another epitaxial apparatus concurrently in operation in the same production line that are output from the thickness measurement device 220 and measured resistivities in the last two cycles of said another epitaxial apparatus concurrently in operation in the same production line that are output from the resistivity measurement device 240; and (iv) a target thickness range and a target resistivity range as specification data.

A specific method of determining the corrected source gas supply time t2 and the corrected dopant gas flow rate D2 as a second set of epitaxial growth conditions will be described below. The corrected source gas supply time t2 and the corrected dopant gas flow rate D2 may be calculated by first correction and second correction described below that are performed on the preset source gas supply time t1 and the preset dopant gas flow rate D1 as the first set of epitaxial growth conditions by the calculation unit 600.

<First Correction>

The calculation unit 600 can perform, as first correction, correction based on a result of comparing the measured thickness te1 and measured resistivity ρe1 of the measurement-use epitaxial wafer with the target thickness specification center tec and target resistivity specification center ρec from the specification data, respectively.

When the measured thickness te1 is larger than the specification center tec, the calculation unit 600 needs to use a correction coefficient of smaller than 1 thereby reducing the source gas supply time. When the measured thickness te1 is smaller than the specification center tec, the calculation unit 600 needs to use a correction coefficient of larger than 1 thereby increasing the source gas supply time. Accordingly, the calculation unit 600 can use tec/te1, {1+ (tec−te1)/tec}, or the like as a formula for calculating the correction coefficient.

When the measured resistivity ρe1 is higher than the specification center ρec, the calculation unit 600 needs to use a correction coefficient of larger than 1 thereby increasing the dopant gas flow rate. When the measured resistivity ρe1 is lower than the specification center ρec, the calculation unit 600 needs to use a correction coefficient of smaller than 1 thereby reducing the dopant gas flow rate. Accordingly, the calculation unit 600 can use ρe1/ρec as a formula for calculating the correction coefficient.

<Second Correction>

The calculation unit 600 can perform, as second correction, correction based on the variation in the measured thickness and the measured resistivity of epitaxial films formed in another single-wafer processing epitaxial apparatus 100 concurrently in operation in the same production line (e.g., the second epitaxial growth apparatus 100-2). The calculation unit 600 performs the second correction using measurement values in at least one epitaxial apparatus in the other epitaxial apparatuses concurrently in operation in the same production line. The calculation unit 600 performs the second correction using measurement values in a plurality of epitaxial apparatuses in the other epitaxial apparatuses concurrently in operation in the same production line. The calculation unit 600 performs the second correction using measurement values in preferably all the other epitaxial apparatuses concurrently in operation in the same production line. In the step of Step S1, another single-wafer processing epitaxial apparatus 100 in the same production line produces an epitaxial wafer in the same manner as the first epitaxial growth apparatus 100-1 works. As the number of apparatuses concurrently in operation in the single-wafer processing epitaxial growth apparatuses 100 in one production line is larger, the pressure in the source gas supply pipe decreases and the liquid temperature in the source gas supply tank decreases. The decreases in the pressure in the source gas supply pipe and the liquid temperature in the source gas supply tank reduce the concentration of the source gas supplied to each single-wafer processing epitaxial growth apparatus 100. This is likely to reduce the epitaxial growth rate.

In that case, the thicknesses of epitaxial films formed in the same epitaxial time are smaller as the number of apparatuses in the single-wafer processing epitaxial growth apparatuses 100 concurrently in operation in the same production line is larger. This requires correction such that the source gas supply time is increased as the number of apparatuses is larger. In addition, as the epitaxial growth rate decreases, the amount of the dopant incorporated into the epitaxial film per unit time increases. Accordingly, the resistivity of epitaxial films formed using the same amount of dopant is lower as the number of apparatuses in the single-wafer processing epitaxial growth apparatuses 100 in operation in the same production line is larger. This requires correction such that the dopant gas flow rate is reduced as the number of apparatuses is larger.

The present inventor found that such correction can be carried out based on the variation in the measured thickness and the measured resistivity of epitaxial films formed by one or more of the other single-wafer processing epitaxial growth apparatuses 100 concurrently in operation in the same production line. Specifically, the inventor found that the source gas concentration decreases as the number of apparatuses in the single-wafer processing epitaxial growth apparatuses 100 concurrently in operation in the same production line is larger. This may be attributed to the following mechanism. When a source gas is supplied to a plurality of single-wafer processing epitaxial growth apparatuses 100 from one source gas supply tank, the pressure in the supply pipe is lower as the number of apparatuses in operation is larger. Further, as more source gas is vaporized, the liquid temperature and the steam pressure decrease. This reduces the concentration of the supplied source gas. In the process of the operation of a plurality of single-wafer processing epitaxial growth apparatus 100 in the same production line in the step of Step S1, as the number of apparatuses in operation is larger, the source gas concentration is lower, and the epitaxial growth rate is found to be low.

To address this, in this embodiment, the operation unit 600 performs correction such that the source gas supply time is increased or the dopant gas flow rate is reduced when the measured thickness or the measured resistivity of epitaxial films formed by one or more of the other single-wafer processing epitaxial growth apparatuses 100 concurrently in operation in the same production line, which have been read from the main storage unit 520, falls. Now, the calculation unit 600 may be configured to determine the fall has occurred for example when the measurement values for the epitaxial films formed at a predetermined time are smaller in more than half of the single-wafer processing epitaxial growth apparatuses 100 concurrently in operation in the same production line than the measurement values for epitaxial films formed at a time before the predetermined time by a predetermined ratio or more. The predetermined ratio may be set to for example 1%. Alternatively, for example, the calculation unit 600 may calculate the moving average of the measured thickness or the measured resistivity of the epitaxial films formed in one or more of the other single-wafer processing epitaxial growth apparatuses 100, and determine the occurrence of the fall based on the moving average.

Further, the operation unit 600 performs correction such that the source gas supply time is reduced or the dopant gas flow rate is increased when the measured thickness or the measured resistivity of epitaxial films formed by one or more of the other single-wafer processing epitaxial growth apparatuses 100 concurrently in operation in the same production line, which have been read from the main storage unit 520, rises. Now, the calculation unit 600 may be configured to determine the rise has occurred for example when the measurement values for the epitaxial films formed at a predetermined time are larger in more than half of the single-wafer processing epitaxial growth apparatuses 100 concurrently in operation in the same production line than the measurement values for epitaxial films formed at a time before the predetermined time by a predetermined ratio or more. The predetermined ratio may be set to for example 1%. Alternatively, for example, the calculation unit 600 may calculate the moving average of the measured thickness or the measured resistivity of the epitaxial films formed in one or more of the other single-wafer processing epitaxial growth apparatuses 100 concurrently in operation in the same production line, and determine the occurrence of the rise based on the moving average.

The method of determining the correction coefficient is not limited as long as the variation in the measured thickness or the measured resistivity of epitaxial films formed in the last cycle of other single-wafer processing epitaxial growth apparatuses 100 concurrently in operation in the same production line are reflected; for example, the correction coefficient may be determined as follows.

The calculation unit 600 acquires the measured thickness and the measured resistivity of epitaxial films formed in the last cycle of other single-wafer processing epitaxial growth apparatuses 100 concurrently in operation in the same production line and the measured thickness and the measured resistivity of an epitaxial film formed in the second last cycle of the same apparatuses. The calculation unit 600 calculates the time-series variation in each apparatus based on the last measured value and the second last measured value. When the variation was equal to or the above the set value in the same direction (either in the rising direction or in the falling direction) in more than half of the apparatuses, the calculation unit 600 determines the correction coefficient based on the data.

Suppose, for example, the second epitaxial growth apparatus 100-2 and the Nth epitaxial growth apparatus 100-N are referred to as apparatuses B and C. The thicknesses of epitaxial films formed in the last cycles of the apparatuses B and C are denoted by teB2 and teC2, respectively. The thicknesses of epitaxial films formed in the second last cycles of the apparatuses B and C are denoted by teB1 and teC1, respectively. The thickness of the epitaxial film formed in the last cycle of the apparatus B is supposed to be smaller than the thickness of the epitaxial film formed in the second last cycle by 1%. Meanwhile, the thickness of the epitaxial film formed in the last cycle of the apparatus C is supposed to be smaller than the thickness of the epitaxial film formed in the second last cycle by 2%. Further, the set value is supposed to be 1%. In this case, the calculation unit 600 finds 1.5% as the average of the reduction ratio of the thickness of the epitaxial films formed in the apparatus B and the reduction ratio of the thickness of the epitaxial films formed in the apparatus C. The calculation unit 600 performs correction to increase the source gas supply time to cover the decrease in the thickness of the epitaxial film. Specifically, the calculation unit 600 corrects the source gas supply time to be longer by 1.5%. Accordingly, a formula of $[1+\{(1-teB2/teB1)+(1-teC2/teC1)\}/2]$ may be used to determine the correction coefficient for the source gas supply time.

<Examples of Correction Formulae>

Specific examples of correction formulae are given below.

For example, the correction formula for the epitaxial growth time may be:

$$t2=t1 \times (tec/te1) \times [1+\{(1-teB2/teB1)+(1-teC2/teC1)\}/2],$$

where t1: preset source gas supply time,
t2: corrected source gas supply time,
tec: specification center of target thickness range,
te1: measured thickness of epitaxial film of measurement-use epitaxial wafer,
teB2: thickness in the last cycle of another apparatus B concurrently in operation in the same production line,
teB1: thickness in the second last cycle of apparatus B concurrently in operation in the same production line,
teC2: thickness in the last cycle of another apparatus C concurrently in operation in the same production line, and
teC1: thickness in the second last cycle of apparatus C concurrently in operation in the same production line,
assuming that the variation in the thicknesses in other apparatuses concurrently in operation in the same production line is teB1/teB2 in the apparatus B and teC1/teC2 in the apparatus C, and the variations for the apparatuses B and C exceed the set value.

For example, the correction formula for the dopant gas flow rate may be:

$$D2=D1 \times (\rho e1/\rho ec)/[1+\{(1-\rho eB2/\rho eB1)+(1-\rho eC2/\rho eC1)\}/2],$$

where

D1: preset dopant gas flow rate,
D2: corrected dopant gas flow rate,
ρec: specification center of target resistivity range,
ρe1: measured resistivity of epitaxial film of measurement-use epitaxial wafer,
ρeB2: resistivity in the last cycle of another apparatus B concurrently in operation in the same production line,
ρB1: resistivity in the second last cycle of apparatus B concurrently in operation in the same production line,
ρeC2: resistivity in the last cycle of another apparatus C concurrently in operation in the same production line, and
ρeC1: resistivity in the second last cycle of apparatus C concurrently in operation in the same production line,
assuming that the variation in the resistivity in other apparatuses concurrently in operation in the same production line is ρeB2/ρeB1 in the apparatus B and ρeC2/ρeC1 in the apparatus C, and the variations for the apparatuses B and C exceed the set value.

The calculation unit 600 outputs the second set of epitaxial growth conditions (the corrected source gas supply time t2 and dopant gas flow rate D2) determined as described above, to the control unit 28 and the main storage unit 520.

(Step S6)

The control unit 28 of the first epitaxial growth apparatus 100-1 in the production system 1000 controls the source gas regulator unit 24 and the dopant gas regulator unit 26 under the second set of epitaxial growth conditions newly determined by the calculation unit 600 in the step presented as Step S6. This allows the first epitaxial growth apparatus 100-1 to produce epitaxial wafers under the second set of epitaxial growth conditions. In this step of Step S6, the first epitaxial growth apparatus 100-1 produces a plurality of, for example, 25/lot×8 lots=200, product-use epitaxial wafers, followed by a production of a measurement-use epitaxial wafer using one monitor wafer.

(Step S7)

The calculation unit 600 of the control device 400 in the production system 1000 determines whether to continue implementing the procedure of the flowchart in FIG. 3 or not in the step presented as Step S7. When the calculation unit 600 determines to continue implementing the procedure in the flowchart of FIG. 3 (Step S7: YES), the process returns to Step S2, and the correction of epitaxial conditions described as the steps of Steps S2 to S5 and the production of an epitaxial wafer under epitaxial conditions obtained by the correction described as the step of Step S6 may be repeated. When the calculation unit 600 determines not to continue implementing the procedure of the flowchart in FIG. 3 (Step S7: NO), the implementation of the procedure of the flowchart in FIG. 3 is terminated, and the production of epitaxial wafers is terminated.

According to the epitaxial wafer production method implemented by the epitaxial wafer production system 1000 of one embodiment of this disclosure as described above, the influence of a reduction in the epitaxial growth rate caused by concurrent operation of apparatuses in the same production line can be timely reflected by correcting the source gas supply time and the dopant gas flow rate based on the variation in the thickness and the resistivity of the epitaxial films formed in other single-wafer processing epitaxial growth apparatuses 100 concurrently in operation in the same production line. Thus, the deviations of the thickness and resistivity of the epitaxial films from the respective specification centers can be reduced.

Although embodiments of controlling both the thickness and the resistivity of epitaxial films by correcting both source gas supply time and dopant gas flow rate have been described above, this disclosure is not limited to this, and one of the thickness and the resistivity of epitaxial films may be controlled by correcting one of the source gas supply time and the dopant gas flow rate.

EXAMPLES

Example of this Disclosure

An example of producing epitaxial silicon wafers by implementing the procedure given in FIG. 3 using the epitaxial wafer production system 1000 illustrated in FIGS. 1 and 2 will be described. The production system 1000 includes four apparatuses as single-wafer processing epitaxial growth apparatuses 100 in one and the same production line. Accordingly, N=4. Both product-use wafers and monitor wafers used a p-type single crystal silicon wafer with a diameter of 300 mm and a resistivity of 10 Ω·cm. The specifications of epitaxial films included a target thickness range of 3.90 µm to 4.10 µm (specification center: 4.00 µm) and a target resistivity range of: 9.0 Ω·cm to 11.0 Ω·cm (specification center: 10.0 Ω·cm). In one (one cycle of) epitaxial growth process, after performing hydrogen baking at 1130° C. for 60 s, a reaction gas mixture, obtained by diluting $SiHCl_3$ as a silicon source and $B_2H_6$ as a boron dopant source with hydrogen gas, was supplied into a chamber of each epitaxial growth apparatus.

An FT-IR thickness measuring device was used as a thickness measurement device, and a resistivity measurement device using the CV method was used as a resistivity measurement device.

In the step of Step S1, while 200 product-use epitaxial wafers were produced in 8 lots, one measurement-use epitaxial wafer was produced using the monitor wafer. After that, in the steps of Step S2 to S5, the source gas supply time and the dopant gas flow rate were corrected in accordance with this disclosure. After that, in the step of Step S6, while 200 product-use epitaxial wafers were produced in 8 lots, one measurement-use epitaxial wafer was produced using the monitor wafer, both with the corrected source gas supply time and the corrected dopant gas flow rate. The steps of Steps S2 to S6 were repeated until 30 measurement-use epitaxial wafers were obtained. The source gas supply time and the dopant gas flow rate were corrected based on the following correction formulae:

$$t2=t1\times(tec/te1)\times(1+\text{Average of variations for apparatuses that have a variation of 1\% or more in the other apparatuses concurrently in operation in the same production line})$$

$$D2=D1\times(\rho e1/\rho ec)/(1+\text{Average of variations for apparatuses that have a variation of 1\% or more in the other apparatuses concurrently in operation in the same production line})$$

Comparative Example

In Comparative Example, correction based on the variation due to the concurrent operation of the other apparatuses in the same production line was not performed. Other than that, epitaxial silicon wafers were produced by the same method as in Example of this disclosure. Namely, the source gas supply time and the dopant gas flow rate were corrected based on the following correction formulae:

$$t2=t1\times(tec/te1)$$

$$D2=D1\times(\rho e1/\rho ec)$$

In performing the method of Comparative Example, one or more operators: (i) measured the thickness and resistivity of the epitaxial film grown on the monitor wafer; (ii) determined the subsequent source gas supply time and dopant gas flow rate based on the measurement result; and (iii) set the determined source gas supply time and dopant gas flow rate in an epitaxial growth apparatus.

[Evaluation of Cpk]

In Example of this disclosure and Comparative Example, the thickness and the resistivity of the epitaxial film in each of the 30 monitor wafers were measured. The deviation of each measurement value from the specification center was then evaluated using the process capability index Cpk. A smaller deviation of the measurement value from the specification center indicates a larger Cpk value. The results are given in Table 1.

TABLE 1

| | Cpk | |
|---|---|---|
| Category | Thickness of epitaxial film | Resistivity of epitaxial film |
| Comparative Example | 1.02 | 0.98 |
| Example | 1.78 | 1.77 |

As is apparent from Table 1, for both the thickness and the resistivity of the epitaxial films, Example of this disclosure had a higher Cpk value than Comparative Example, thus the deviations from the specification center were successfully reduced.

INDUSTRIAL APPLICABILITY

A production system and a production method for an epitaxial wafer, according to this disclosure can control the source gas supply time and the dopant gas flow rate with high accuracy, thereby reducing the deviations of the thickness and resistivity of the epitaxial films from the respective specification centers.

The invention claimed is:

1. A control device for single-wafer processing epitaxial growth apparatuses, comprising:
a calculation unit generating control information of one of a plurality of epitaxial growth apparatuses that needs new control, the apparatuses being provided in one production line to produce an epitaxial wafer by forming an epitaxial film on a surface of a wafer using a dopant gas and a source gas supplied from one source gas source as materials; and
a storage unit storing at least one of a measured thickness and a measured resistivity of an epitaxial film formed in the epitaxial growth apparatus that needs new control in the plurality of epitaxial growth apparatuses provided in the same production line, at least one of a measured thickness and a measured resistivity of an epitaxial film formed in another one of the other epitaxial growth apparatuses in the same production line that is concurrently in operation with the epitaxial growth apparatus that needs new control, and specifications of a product that are set in the epitaxial growth apparatus that needs new control,
wherein the calculation unit generates information for controlling at least one of a supply time of the source gas and a flow rate of the dopant gas in the epitaxial growth apparatus that needs new control, based on at least one of the measured thickness and the measured resistivity of the epitaxial film formed in the epitaxial growth apparatus that needs new control and at least one of the measured thickness and the measured resistivity of the epitaxial film formed in said another epitaxial growth apparatus in the same production line that is concurrently in operation, the measurement values being stored in the storage unit; and outputs the information to the epitaxial growth apparatus that needs new control.

2. The control device for single-wafer processing epitaxial growth apparatuses, according to claim 1, wherein when a measured thickness of an epitaxial film formed at a predetermined time in said another epitaxial growth apparatus in the same production line is smaller than a measured thickness of the epitaxial film formed at a time prior to the predetermined time by a predetermined ratio or more, the measured thicknesses being read from the storage unit, the calculation unit corrects the supply time of the source gas to be longer, and generates the corrected value as information for controlling the supply time of the source gas.

3. The control device for single-wafer processing epitaxial growth apparatuses, according to claim 1, wherein when a measured resistivity of the epitaxial film formed at a predetermined time in said another epitaxial growth apparatus in the same production line is lower than a measured resistivity of an epitaxial film formed at a time prior to the predetermined time by a predetermined ratio or more, the measured resistivities being read from the storage unit, the calculation unit corrects the flow rate of the dopant gas to be lower, and generate s the corrected value as information for controlling the flow rate of the dopant gas.

4. The control device for single-wafer processing epitaxial growth apparatuses, according to claim 2, wherein when a measured resistivity of the epitaxial film formed at a predetermined time in said another epitaxial growth apparatus in the same production line is lower than a measured resistivity of an epitaxial film formed at a time prior to the predetermined time by a predetermined ratio or more, the measured resistivities being read from the storage unit, the calculation unit corrects the flow rate of the dopant gas to be lower, and generates the corrected value as information for controlling the flow rate of the dopant gas.

5. The control device for single-wafer processing epitaxial growth apparatuses, according to claim 1, wherein when a measured thickness of an epitaxial film formed at a predetermined time in said another epitaxial growth apparatus in the same production line is larger than a measured thickness of the epitaxial film formed at a time prior to the predetermined time by a predetermined ratio or more, the measured thicknesses being read from the storage unit, the calculation unit corrects the supply time of the source gas to be shorter, and generates the corrected value as information for controlling the supply time of the source gas.

6. The control device for single-wafer processing epitaxial growth apparatuses, according to claim 1, wherein when a measured resistivity of the epitaxial film formed at a predetermined time in said another epitaxial growth apparatus in the same production line is higher than a measured resistivity of an epitaxial film formed at a time prior to the predetermined time by a predetermined ratio or more, the measured resistivities being read from the storage unit, the calculation unit corrects the flow rate of the dopant gas to be higher, and generates the corrected value as information for controlling the flow rate of the dopant gas.

7. The control device for single-wafer processing epitaxial growth apparatuses, according to claim 2, wherein when a measured resistivity of the epitaxial film formed at a predetermined time in said another epitaxial growth apparatus in the same production line is higher than a measured resistivity of an epitaxial film formed at a time prior to the predetermined time by a predetermined ratio or more, the measured resistivities being read from the storage unit, the calculation unit corrects the flow rate of the dopant gas to be higher, and generates the corrected value as information for controlling the flow rate of the dopant gas.

8. An epitaxial wafer production system comprising the control device for single-wafer processing epitaxial growth apparatuses, according to claim 1; and the plurality of epitaxial growth apparatuses provided in one production line.

9. An epitaxial wafer production system comprising the control device for single-wafer processing epitaxial growth apparatuses, according to claim 2; and the plurality of epitaxial growth apparatuses provided in one production line.

10. An epitaxial wafer production system comprising the control device for single-wafer processing epitaxial growth apparatuses, according to claim 3; and the plurality of epitaxial growth apparatuses provided in one production line.

11. An epitaxial wafer production system comprising the control device for single-wafer processing epitaxial growth apparatuses, according to claim 4; and the plurality of epitaxial growth apparatuses provided in one production line.

12. An epitaxial wafer production system comprising the control device for single-wafer processing epitaxial growth apparatuses, according to claim 5; and the plurality of epitaxial growth apparatuses provided in one production line.

13. A control method for single-wafer processing apparatuses including a control device controlling one of a plurality of epitaxial growth apparatuses that needs new control, the apparatuses being provided in one production line to produce an epitaxial wafer by forming an epitaxial film on a surface of a wafer using a dopant gas and a source gas supplied from one source gas source as materials, comprising: a step of storing at least one of a measured thickness and a measured resistivity of an epitaxial film formed in the epitaxial growth apparatus that needs new control in the plurality of epitaxial growth apparatuses provided in the same production line, and at least one of a measured thickness and a measured resistivity of an epitaxial film formed in each of the other epitaxial growth apparatuses in the same production line that are concurrently in operation with the epitaxial growth apparatus that needs new control, the step being performed by the control device; and a step of generating information for controlling at least one of a supply time of the source gas and a flow rate of the dopant gas in the epitaxial growth apparatus that needs new control, based on at least one of the measured thickness and the measured resistivity of the epitaxial film formed in the epitaxial growth apparatus that needs new control and at least one of the measured thickness and the measured resistivity of the epitaxial film formed in each of the other epitaxial growth apparatuses in the same production line that are concurrently in operation, the measurement values being stored; and outputting the information to the epitaxial growth apparatus that needs new control, the step being performed by the control device.

\* \* \* \* \*

UNITED STATES PATENT AND TRADEMARK OFFICE
CERTIFICATE OF CORRECTION

PATENT NO. : 12,261,065 B2  
APPLICATION NO. : 17/807705  
DATED : March 25, 2025  
INVENTOR(S) : Naoyuki Wada Page 1 of 1

It is certified that error appears in the above-identified patent and that said Letters Patent is hereby corrected as shown below:

In the Claims

| Column | Line(s) | |
|---|---|---|
| 20 | 4 | Claim 3, delete "generate s" and insert -- generates -- |
| 20 | 53 | Claim 8, delete "claim 1;" and insert -- claim 1, -- |
| 20 | 58 | Claim 9, delete "claim 2;" and insert -- claim 2, -- |
| 20 | 63 | Claim 10, delete "claim 3;" and insert -- claim 3, -- |
| 21 | 1 | Claim 11, delete "claim 4;" and insert -- claim 4, -- |
| 21 | 6 | Claim 12, delete "claim 5;" and insert -- claim 5, -- |

Signed and Sealed this  
Tenth Day of February, 2026

John A. Squires  
*Director of the United States Patent and Trademark Office*